SEMICONDUCTOR CIRCUITS UTILIZING A STORAGE DIODE

Filed Feb. 19, 1958 2 Sheets-Sheet 1

INVENTORS:
HAROLD W. ABBOTT,
LAWRENCE D. WECHSLER,
BY Charles M. Hutchins
THEIR ATTORNEY.

March 21, 1961 H. W. ABBOTT ET AL 2,976,429

SEMICONDUCTOR CIRCUITS UTILIZING A STORAGE DIODE

Filed Feb. 19, 1958 2 Sheets-Sheet 2

INVENTORS:
HAROLD W. ABBOTT,
LAWRENCE D. WECHSLER,

BY Charles M. Hutchins

THEIR ATTORNEY.

United States Patent Office 2,976,429

Patented Mar. 21, 1961

2,976,429

SEMICONDUCTOR CIRCUITS UTILIZING A STORAGE DIODE

Harold W. Abbott, Albany, and Lawrence D. Wechsler, Syracuse, N.Y., assignors to General Electric Company, a corporation of New York Filed Feb. 19, 1958, Ser. No. 716,194

8 Claims. (Cl. 307—88.5)

This invention relates to electrical circuits including semiconductor devices. More particularly, this invention relates to electrical circuits such as amplifiers or multivibrators utilizing a semiconductor storage diode as the active element thereof.

It is well known that semiconductor junction diodes, in addition to a barrier capacitance storage effect which is noticeable at extremely high frequencies, also exhibit another storage effect which determines their response at considerably lower frequencies if the diode is biased in the forward direction for a part of the cycle of an applied high frequency voltage. This latter storage effect consists of the temporary storage of injected excess minority carriers in the higher resistivity side of the junction and shows up most clearly in pulsed operation of the diode. Virtually any semiconductor diode will exhibit this storage effect to a certain degree depending upon the type of diode and the frequency at which it is operated. However, it is convenient to restrict the definition of the term "storage diode" to mean any diode having characteristics such that when operated at an appropriate frequency it will exhibit this storage effect to a substantial or usable degree. For a more complete discussion of the semiconductor physics involved in this storage effect, reference is made to an article by Robert H. Kingston entitled "Switching Time in Junction Diodes and Junction Transistors" appearing at pp. 829–834 of volume 42 of the "Proceedings of the Institute of Radio Engineers" for May 1954, or to an article by R. G. Shulman and M. E. McMahon entitled "Recovery Currents in Germanium P-N Junction Diodes" appearing at pp. 1267–1272 of Volume 24 of the "Journal of Applied Physics" for October 1953.

One semiconductor diode amplifier circuit utilizing this storage effect is described in an article entitled "Diode Amplifiers" which appeared in the magazine "Electronic Design" at pp. 24 and 25 of the issue of October 1954. In one typical circuit described therein, a semiconductor storage diode and a load resistor are connected in series between a source of half-wave rectified radio frequency power, sometimes referred to as the clock, and ground. The polarity of the power supply is such as to bias the diode in the reverse or high impedance direction. Input signal is applied to the amplifier through a high frequency switching or non-storage diode connected to the junction point of the load resistor and the storage diode with such a polarity that an applied input signal will bias the storage diode in the forward direction when the R-F power supply is at zero volts. In the absence of an applied input signal, there is virtually no output across the load resistor because the high impedance of the storage diode in its reverse biased state causes all of the supply voltage to appear across the diode and virtually none to appear across the load. When an input signal is applied while the instantaneous power supply voltage is at zero volts, carriers are injected into the storage diode by a current in its forward direction. When the power supply voltage, sometimes referred to as clock voltage, switches back from zero to a reverse bias, the storage diode initially presents a very low impedance to the reverse voltage due to the presence of the stored carriers. Since the impedance of the storage diode is then low compared to that of the load resistor, most of the power supply voltage appears across the resistor until the stored carriers are swept out of the diode by the transient reverse current. Thus amplification is achieved by using the input signal to inject into the storage diode minority carriers which are later swept out as a transient current in response to application of a reverse bias power supply voltage.

In such a circuit the requirements on the power supply are very severe in that during the time the power supply voltage is at zero volts the power supply impedance should be very low so that as much as possible of the available input signal power will be across the diode and not divided between the diode and the power supply. Since the power supply impedance remains low during both phases of the amplification cycle, considerable power will be dissipated within the power source itself. Furthermore, the circuit requires a rectified power supply voltage.

It is therefore an object of this invention to provide an improved diode amplifier circuit in which efficient use is made of the power available from the power source.

It is a further object of this invention to provide a diode amplifier circuit adapted for use with a power supply of alternating positive and negative polarity, thereby eliminating the necessity for either rectification or the establishment of a D.-C. bias.

It is a further object of this invention to provide a dynamic multivibrator or flip-flop circuit using the improved diode amplifier of the present invention and having the ability to furnish power to a low impedance load.

Briefly, in accordance with one aspect of this invention, a semiconductor storage diode has applied thereto a bipolar radio frequency power supply voltage in such a manner that during one-half of each of the supply voltage cycles the diode is normally biased in the forward direction to inject carriers therein and during the other half of the supply voltage cycle the diode is normally biased in the reverse direction to sweep carriers therefrom in a transient reverse current. Output is taken directly across the diode itself. Since the injected carriers render the impedance of the diode low during the transient reverse current there is normally no output signal. Input signal is applied to a clamping means, such as another diode, in such a manner that in the presence of the input signal no carriers can be injected into the storage diode. Consequently, when an input signal has been applied to prevent injection during the first half of the R-F cycle, the resulting high reverse impedance of the diode causes an amplified output signal to appear during the reverse bias portion of the power supply cycle. Addition of appropriate feedback means to the amplifier circuit leads to a dynamic flip-flop circuit.

While the novel and distinctive features of the invention are particularly pointed out in the appended claims, a more expository treatment of the invention, in principle and in detail, together with additional objects and advantages thereof, is afforded by the following description and accompanying drawings in which:

Fig. 1 is a schematic circuit diagram of one embodiment of diode amplifier;

Figs. 2*a* through 2*e* are a group of idealized waveform diagrams drawn on a common time scale wherein time is plotted as abscissa and various voltages appearing in the circuit of Fig. 1 are plotted as ordinates;

Figure 1:
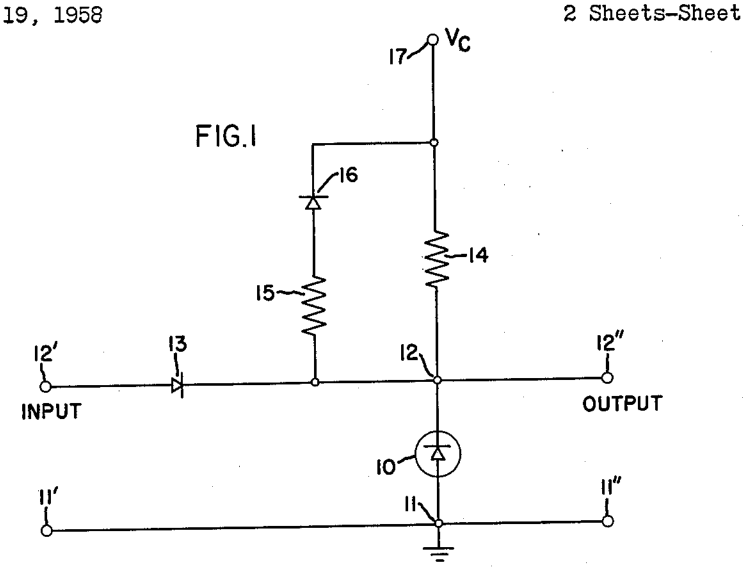

Turning now to the drawings, and in particular to Fig. 1 thereof, there is shown a diode amplifier circuit including a storage diode 10 of the P-N junction type, i.e. a rectifying junction type of storage device. In one particular embodiment of the invention storage diode 10 was a General Electric type 1N93 diode operated by a power supply voltage having a frequency of one megacycle. However, any diode falling within the above definition of a storage diode can of course be used. The anode of diode 10 is connected to a common or grounded terminal 11 which is directly connected to an input terminal 11′ and an output terminal 11″. The cathode of diode 10 is connected to a terminal 12 which is in turn directly connected to an output terminal 12″ and is also connected through a switching or high frequency diode 13 to a signal input terminal 12′. A power supply voltage $V_c$ is applied to a terminal 17 from a suitable power supply source (not shown). The parallel combination of a first resistor 14 and a series-connected resistor 15 and diode 16 is connected between terminals 17 and 12. In the particular embodiment referred to above, the two high-frequency or switching diodes 13 and 16 were both General Electric type 1N70 diodes, resistors 14 and 15 both had values of 2000 ohms, and the frequency of the bipolar rectangular power supply voltage applied to terminal 17 was one megacycle. It should of course be understood, however, that these particular values are exemplary only and are not to be construed as critical limitations. In particular, the frequency and waveform of the clock voltage may be varied to suit any particular application. Its fundamental frequency need only be equal to or greater than the frequency of the modulating signal to be applied to input terminal 12′.

Figure 2A:
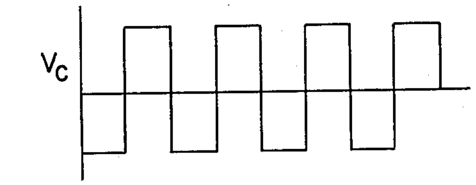
Figure 2B:
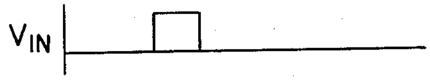
Figure 2C:
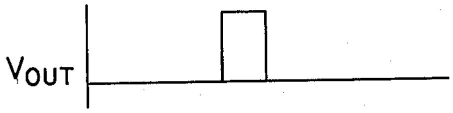

The operation of the circuit of Fig. 1 may be more readily understood by reference to the idealized waveform diagrams in Figs. 2*a* through 2*e*. Fig. 2*a* is a graph wherein the power supply voltage, $V_c$, applied to terminal 17 plotted as ordinate against time plotted as abscissa. Although this power supply voltage is shown as a bipolar or bidirectional rectangular waveform, it should be understood that a sinusoidal or any other suitable bipolar waveform could be used. During the negative portion of the power supply voltage cycle, both the switching diode 16 and the storage diode 10 are biased in the forward or low resistance direction. Hence, the impedance between terminals 17 and 12 consists essentially of the parallel combination of the two resistors 14 and 15. If these two resistors are of equal value, their effective value in parallel is of course equal to one-half their individual value. Consequently, in the absence of an input signal on terminal 12′, a fairly large current will flow through the storage diode 10. This forward or low resistance current flow through the storage diode 10 will inject minority carriers therein. During the next half-cycle of the power supply voltage, that is, during the positive half-cycle of the power supply voltage, both the switching diode 16 and the storage diode 10 are biased in their reverse or high impedance direction. Consequently, the effective impedance between terminals 17 and 12 is very nearly equal to the value of resistor 14 alone. Due to the presence of the injected carriers stored in diode 10, the impedance of this diode at the beginning of the positive half-cycle is extremely small even though it is biased in the reverse direction. Consequently, while these carriers are being swept out in a transient reverse current through resistor 14, nearly all of the positive clock voltage will appear between terminals 17 and 12, and virtually no output voltage will appear at output terminal 12″. In Fig. 2*b* there is illustrated an input signal in the form of a positive voltage pulse which may be applied to input terminal 12′ during the next negative half-cycle of the power supply voltage. Application of such a positive input signal at terminal 12′ effectively clamps terminal 12 of the storage diode to positive voltages only. That is, upon the application of the negative power supply voltage, diode 13 will start to conduct prior to the conduction of the storage diode 10, thereby preventing the storage diode from ever reaching a forward bias condition. As a result of this action, no carriers will be injected into the storage diode. Upon subsequent application of the positive half-cycle of the power supply voltage, the high reverse impedance of the storage diode will result in the appearance of this voltage at the output terminal 12″. This output voltage is illustrated in Fig. 2*c*.

Figure 2D:
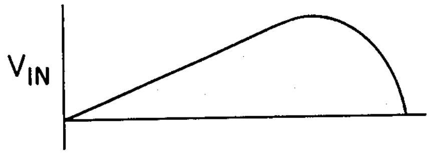
Figure 2E:
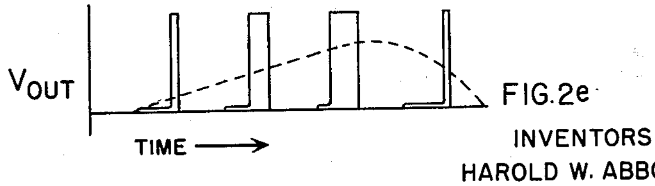

It will be noted that an output voltage is derived only during the positive half-cycle of the power supply voltage. This particular property of the circuit peculiarly adapts it for use in dynamic digital computer techniques wherein it is often desired that an input pulse, such as shown in Fig. 2*b*, may be simultaneously delayed and amplified to provide an output pulse such as shown in Fig. 2*c*. On the other hand, if a continuous input signal such as shown in Fig. 2*d* is applied to input terminal 12′, the output signal appearing at terminal 12″ will be a series of pulses such as shown in solid lines in Fig. 2*e*. The pulses shown in Figure 2*e* may be seen to have an initial low pedestal portion whose time duration varies inversely with the magnitude of the input wave-form followed by a high amplitude portion whose width varies directly with the amplitude of the input signal. The average value of these high amplitude output pulses, as shown by the dashed line in Fig. 2*e*, will afford an amplified version of the input signal of Fig. 2*d*. This average value may, if desired, be obtained as an actual voltage by passing the output pulses through a low-pass filter, as is well-known.

One further point should be noted in connection with the operation of the circuit of Fig. 1. It will be observed that during the negative portion of the power supply cycle the impedance of diode 16 is substantially zero and the total impedance between terminals 17 and 12 is therefore effectively the parallel combination of resistors 14 and 15. On the positive half-cycle, however, the impedance of diode 16 is so large as to be nearly an open circuit for all practical purposes. The impedance between terminals 17 and 12 is therefore substantially equal to the impedance of resistor 14. It follows that a larger current will flow in the circuit in response to the same applied voltage during the negative half-cycle than will flow during the positive half-cycle. This increase in current during the negative half-cycle of the power supply voltage is used to compensate for the loss of carriers as a result of recombination within the storage diode, and thereby affords greater power handling capacity than can be achieved with other embodiments to be described below. A circuit having the configuration of Fig. 1, and using components having the specific values given above in connection with the exemplary embodiment, was found to be capable of handling power in excess of 20 watts with a power gain of approximately 50.

Figure 3:
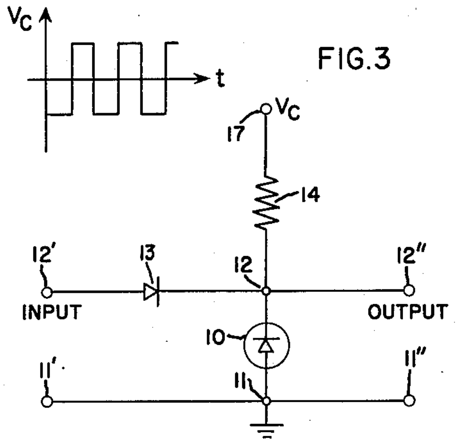
Fig. 3 is a schematic circuit diagram of a simplified diode amplifier.

The diode amplifier circuit of Fig. 1 may be simplified in the manner illustrated by the circuit diagram of Fig. 3. In Fig. 3 corresponding elements which have already been described in connection with Fig. 1 are identified by the same reference characters and will not be again described. Actually, the circuit of Fig. 3 is the same as that of Fig. 1 except that resistor 15 and switching diode 16 have been omitted so that the impedance between terminals 17 and 12 remains constant during both the cyclic portions of the power supply. This prevents the increased current flow during the negative half cycle of the power supply voltage so that in the operation of this simplified version of the circuit, the quantity of stored carriers is not sufficient to give a negligible output in the absence of an input signal. The on-off ratio for this circuit arrangement is in the order of 10 to 1. For those applications which can tolerate an on-off ratio of this magnitude, the circuit affords some economy of components.

Figure 4:
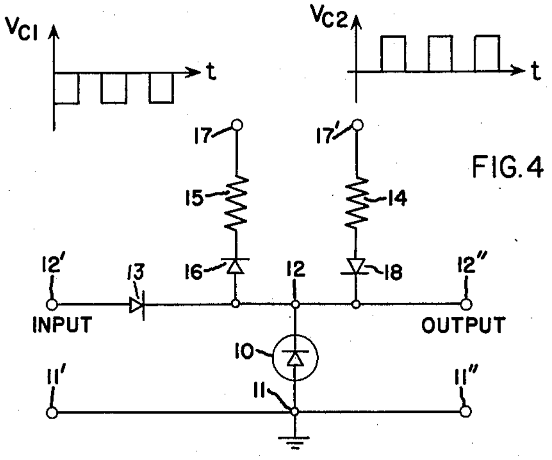
Fig. 4 is a schematic circuit diagram of another embodiment of diode amplifier.

In Fig. 4 there is shown another embodiment of the diode amplifier circuit similar to that shown in Fig. 1. Again like components have been indicated by like reference characters. In Fig. 4 the diode 16 and resistor 15 are connected to a power supply terminal 17 which is adapted to have a half-wave recified negative polarity power supply voltage $V_{c1}$ applied thereto. A similar switching diode 18 is connected in series with resistor 14 between terminal 12 and a second power supply voltage terminal 17' which is adapted to have a half-wave rectified positive power supply voltage $V_{c2}$ applied thereto. Of course, diodes 16 and 18 have opposite polarities from each other with respect to the terminal 12 of storage diode 10. That is to say, diode 16 is poled so as to be biased in the forward direction by a negative power supply voltage whereas diode 18 is poled so as to be biased in the forward direction by a positive power supply voltage.

The operation of the circuit of Fig. 4 is substantially the same as that of the circuit of Fig. 1. The configuration shown in Fig. 4 may conveniently be used where separate sources of half wave rectified power supply voltages are already available. Additionally, the circuit affords a somewhat greater degree of flexibility in the control of the ratio of the impedance between terminal 12 and the clock voltage sources during the positive and negative half-cycles. The ratio of this impedance during the injection half of the cycle to this impedance during the sweeping out half of the cycle may, in the circuit of Fig. 4, be readily controlled simply by varying the values of independent resistors 14 and 15. Of course, it will also be understood that, if desired, a single power supply voltage such as shown in Fig. 2*a* could be applied to both terminals 17 and 17'. The operation of the circuit would be the same in view of the presence of oppositely-poled diodes 16 and 18.

Figure 5:
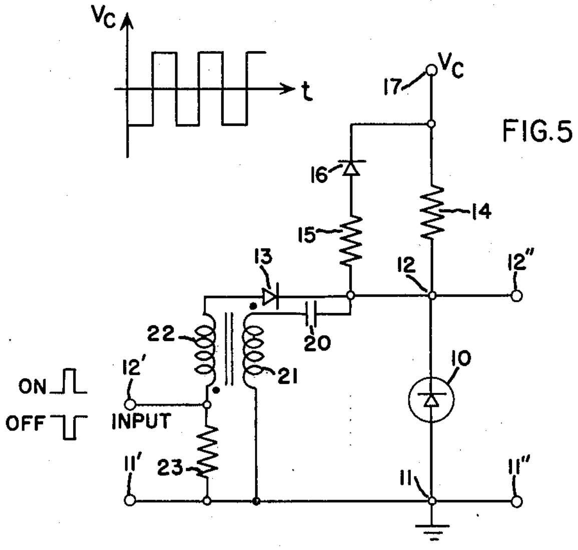
Fig. 5 is a schematic circuit diagram of a dynamic flip-flop or multivibrator circuit using the diode amplifier of Fig. 1.

In Fig. 5 there is shown a schematic circuit diagram illustrating how the diode amplifier of Fig. 1 may be incorporated in a dynamic "flip-flop" or multivibrator circuit which may be triggered into free-running oscillation at the frequency of the power supply voltage by an appropriate input signal. Again corresponding components have been indicated by like reference characters and will not be further described. In Fig. 5, a capacitor 20 and inductor 21 are connected in series circuit relationship between the terminals 12 and 11 of storage diode 10. Capacitor 20 and inductor 21, of course, form a tuned circuit, the resonant frequency of which should be equal to or less than the frequency of the power supply voltage. A second inductor 22 is connected in series between input terminal 12' and diode 13. Inductors 22 and 21 are positioned in inductively-coupled relationship and are wound so as to have the relative phasing indicated by the conventional dots associated therewith in Fig. 5. A small resistor 23 is connected across input terminals 11' and 12'.

When no input signal is applied across resistor 23, the circuit of Fig. 5 operates in a manner entirely similar to the diode amplifier of Fig. 1 and yields essentially zero output at terminals 12 or 12''. Upon application of a positive pulse to input terminal 12', diode 13 clamps terminal 12 to positive voltages only. This clamping action prevents the storage of minority carriers in the diode 10 during the negative half-cycle of the power supply voltage and results in the positive half-cycle of the power supply voltage appearing at terminal 12. As a result of the mutual coupling between the two coils or inductors 21 and 22, this voltage will be fed back to the input circuit in the proper phase to maintain a positive input signal on diode 13 during the next negative half-cycle of the power supply voltage. This again prevents injection of carriers during the next cycle. Consequently, the output signal at terminal 12 will be maintained after the positive input pulse is removed from input terminal 12'. In other words the application of a short positive trigger pulse to input terminal 12' will trigger the normally quiescent circuit into a state of oscillation which is sustained by regenerative feedback. On the other hand, application of a negative trigger pulse to input terminal 12' will temporarily cut off or reverse-bias the diode 13 and thereby permit the injection of carriers into storage diode 10 by the next negative half-cycle of the clock voltage. Once this has occurred, the output at terminal 12 will drop to zero resulting in the elimination of the feedback signal. Thereafter, the system will remain in its quiescent state with no output signal at terminal 12 or 12'' even after the negative input pulse is removed. In one particular exemplary embodiment of the circuit of Fig. 5, the trigger requirements for both positive and negative trigger pulses were approximately a 1.5 volt pulse with a time duration of 10 microseconds. A continuous on-off repetition rate of 2 kilocycles was achieved in that particular circuit.

Of course it will be understood that the diode amplifiers of Figs. 3 or 4 could be used in dynamic "flip-flop" circuits similar to that of Fig. 5. It will of course also be understood that the diode amplifier circuits of Figs. 1, 3 and 4 may be embodied in many other networks in accordance with the requirements of a particular application.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefor intended to cover and embrace any such modifications within the limits of the true spirit and scope of the invention.

What we claim as new and desire to secure by Letters Patent of the United States is:

1. An active electrical circuit comprising, a diode having a body of semiconductor material including a p-n junction therein and further having anode and cathode electrodes on opposite sides respectively of said junction, said semiconductor material of said body material of said body being capable of transient storage of electrical carriers injected therein; a first of the electrodes of said storage diode being connected to ground, the second of the electrodes of said storage diode being connected through an impedance to a source of supply voltage of predetermined frequency, said supply voltage being such that during one-half of each of its cycles said storage diode is normally biased in the forward direction to inject carriers into said diode and during the other half of each of its cycles said diode is normally biased in the reverse direction to sweep carriers out of said diode in a transient reverse current; a switching diode having one electrode connected to the junction point of said storage diode and said impedance element said diodes being poled to pass current in the same direction and means for coupling an input signal between the second electrode of said switching diode and ground whereby the presence of an input signal controls the injection of carriers by said supply voltage into said storage diode; and means to derive an output signal from said junction point of said storage diode and said impedance element.

2. Apparatus as in claim 1 wherein said impedance is a resistor.

3. Apparatus as in claim 1 wherein said impedance comprises first and second series circuits each consisting of a resistor and diode, the diodes in said first and second series circuits having opposite polarities with respect to said second electrode of said storage diode.

4. Apparatus as in claim 1 wherein said impedance comprises the parallel combination of a first resistor and a series connected second resistor and diode.

5. Apparatus as in claim 1 wherein said means to derive an output signal comprises a series tuned circuit connected across the electrodes of said storage diode and coupling means to apply a portion of the voltage appearing across said tuned circuit to said switching diode with a polarity affording regenerative feedback whereby said circuit may be triggered into and out of sustained oscillation by applying to said switching diode input signals of respectively opposite polarity.

6. A dynamic flip-flop circuit comprising, a storage diode comprising a body of semiconductor material having a p–n junction therein and further having anode and cathode electrodes on opposite sides respectively of said junction, said semiconductor material of said body being capable of transient storage of electrical carriers injected therein; means to apply a supply voltage of predetermined frequency to said storage diode, said supply voltage being such that during one-half of each of its cycles said diode is normally biased in the forward direction to inject carriers into said diode and during the other half of each of its cycles said diode is normally biased in the reverse direction to sweep carriers out of said diode in a transient reverse current; a tuned circuit connected across the electrodes of said storage diode; clamping means responsive to an input signal to clamp one electrode of said diode to a voltage level such as to prevent the injection of carriers by said supply voltage while said input signal is applied; and means to apply a portion of the voltage appearing in said tuned circuit to said clamping means as a regenerative feedback signal.

7. An active electrical circuit comprising, a storage diode having a body of semiconductor material including a p-n junction therein and further having anode and cathode electrodes on opposite sides respectively of said junction, said semiconductor material of said body being capable of transient storage of electrical carriers injected therein; a bipolar voltage supply of predetermined frequency; an impedance means in series with said storage diode connected across said supply, said supply voltage being such that during one-half of each of its cycles said diode is normally biased in the forward direction to inject carriers into said diode and during the other half of each of its cycles said diode is normally biased in the reverse direction to sweep carriers out of said diode in a transient reverse current; a signal input circuit connected in shunt with said storage diode comprising a pair of signal input terminals for connection to a source of signals for providing upon connection of said source thereto, a path in shunt with said storage diode whereby the presence of an input signal coupled to said input terminals controls the injection of carriers by said supply voltage into said storage diode; and means to derive an output signal from across said storage diode.

8. An active electrical circuit comprising, a storage diode having a body of semiconductor material including a p-n junction therein and further having anode and cathode electrodes on opposite sides respectively of said junction, said semiconductor material of said body being capable of transient storage of electrical carriers injected therein; a bipolar voltage supply of predetermined frequency; impedance means in series with said storage diode connected across said supply, said supply voltage being such that during one-half of each of its cycles said diode is normally biased in the forward direction to inject carriers into said diode and during the other half of each of its cycles said diode is normally biased in the reverse direction to sweep carriers out of said diode in a transient reverse current; a signal input circuit comprising a second diode and a pair of signal input terminals connected in series, the series circuit so formed being connected in shunt with said storage diode with said diodes poled to pass current in the same direction in said shunting paths whereby the presence of an input signal coupled to said input terminals controls the injection of carriers by said supply voltage into said storage diode; and means to derive an output signal from across said storage diode.

References Cited in the file of this patent

UNITED STATES PATENTS

| | | |
|---|---|---|
| 2,512,639 | Gohorel | June 27, 1950 |
| 2,627,575 | Meacham et al. | Feb. 3, 1953 |
| 2,737,601 | McMahon | Mar. 6, 1956 |
| 2,787,707 | Cockburn | Apr. 2, 1957 |
| 2,823,321 | Sims | Feb. 11, 1958 |
| 2,879,409 | Holt | Mar. 24, 1959 |

FOREIGN PATENTS

| | | |
|---|---|---|
| 158,879 | Australia | Sept. 16, 1954 |
| 160,213 | Australia | Dec. 10, 1954 |
| 166,800 | Australia | Feb. 6, 1956 |
| 1,108,082 | France | Jan. 9, 1956 |

OTHER REFERENCES

Article 1, "Now Diodes Amplify," Radio-Electronics, November 1954, pages 94–95.

Article 2, "Diode Amplifier," National Bureau of Standards Technical News Bulletin, vol. 38, October 1954, No. 10, pages 145–148.